(12) United States Patent
Greywall

(10) Patent No.: US 7,410,907 B2
(45) Date of Patent: Aug. 12, 2008

(54) FABRICATING INTEGRATED DEVICES USING EMBEDDED MASKS

(75) Inventor: Dennis S. Greywall, Whitehouse Station, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 340 days.

(21) Appl. No.: 11/095,071

(22) Filed: Mar. 31, 2005

(65) Prior Publication Data
US 2006/0228896 A1 Oct. 12, 2006

(51) Int. Cl.
*H01L 21/302* (2006.01)
*H01L 21/461* (2006.01)

(52) U.S. Cl. .............. 438/736; 438/735; 257/E21.331; 257/E21.215

(58) Field of Classification Search ............... 438/735, 438/736; 257/E21.215, E21.219, E21.331
See application file for complete search history.

(56) References Cited

U.S. PATENT DOCUMENTS

| | | | | |
|---|---|---|---|---|
| 6,025,273 A | * | 2/2000 | Chen et al. | 438/706 |
| 6,143,190 A | * | 11/2000 | Yagi et al. | 216/27 |
| 6,201,631 B1 | * | 3/2001 | Greywall | 359/245 |
| 6,533,947 B2 | * | 3/2003 | Nasiri et al. | 216/2 |
| 6,544,863 B1 | * | 4/2003 | Chong et al. | 438/455 |
| 6,563,106 B1 | * | 5/2003 | Bowers et al. | 250/216 |
| 6,760,144 B2 | * | 7/2004 | Hill et al. | 359/290 |
| 6,872,319 B2 | * | 3/2005 | Tsai | 216/2 |
| 6,995,895 B2 | | 2/2006 | Greywall | 359/290 |
| 2003/0022516 A1 | * | 1/2003 | Arima | 438/737 |
| 2003/0174035 A1 | * | 9/2003 | Arima | 335/220 |
| 2003/0174383 A1 | * | 9/2003 | Bolle et al. | 359/295 |
| 2004/0141027 A1 | * | 7/2004 | Truninger et al. | 347/47 |
| 2004/0190110 A1 | | 9/2004 | Greywall | 359/291 |
| 2005/0088491 A1 | * | 4/2005 | Truninger et al. | 347/71 |
| 2005/0112843 A1 | * | 5/2005 | Fischer et al. | 438/455 |

* cited by examiner

*Primary Examiner*—Scott B. Geyer
*Assistant Examiner*—Seahvosh J Nikmanesh

(57) ABSTRACT

A method of fabricating a device using a multi-layered wafer that has an embedded etch mask adapted to map a desired device structure onto an adjacent (poly)silicon layer. Due to the presence of the embedded mask, it becomes possible to delay the etching that forms the mapped structure in the (poly)silicon layer until a relatively late fabrication stage. As a result, flatness of the (poly)silicon layer is preserved for the deposition of any necessary over-layers, which substantially obviates the need for filling the voids created by the structure formation with silicon oxide.

15 Claims, 19 Drawing Sheets

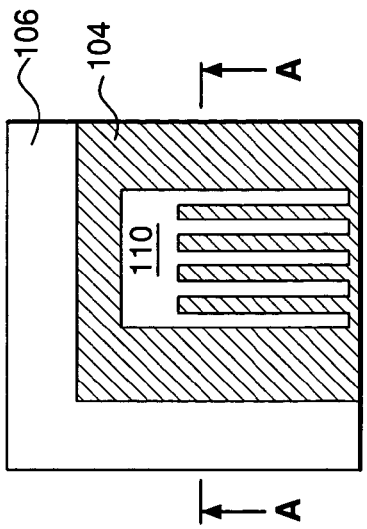
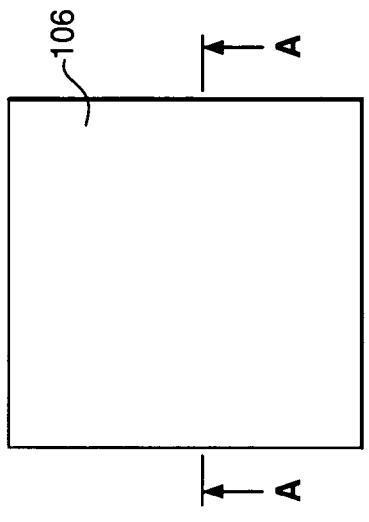
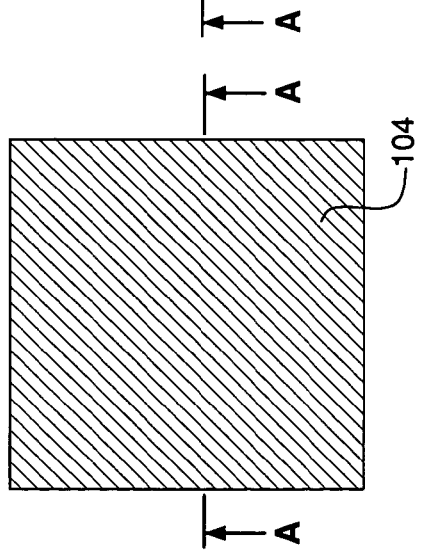
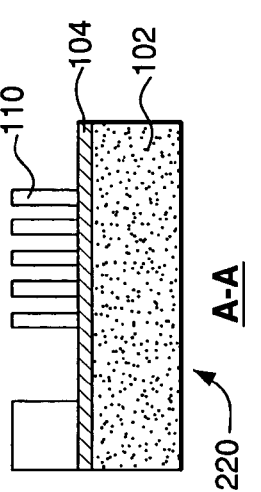
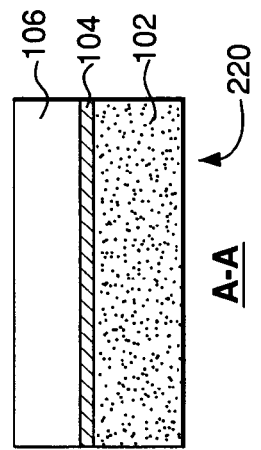
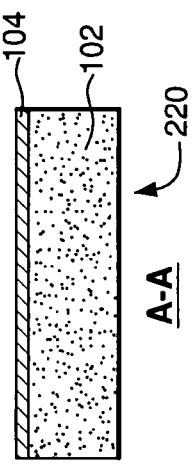
Fig. 2A (prior art)
Fig. 2C (prior art)
Fig. 2E (prior art)
Fig. 2B (prior art)
Fig. 2D (prior art)
Fig. 2F (prior art)

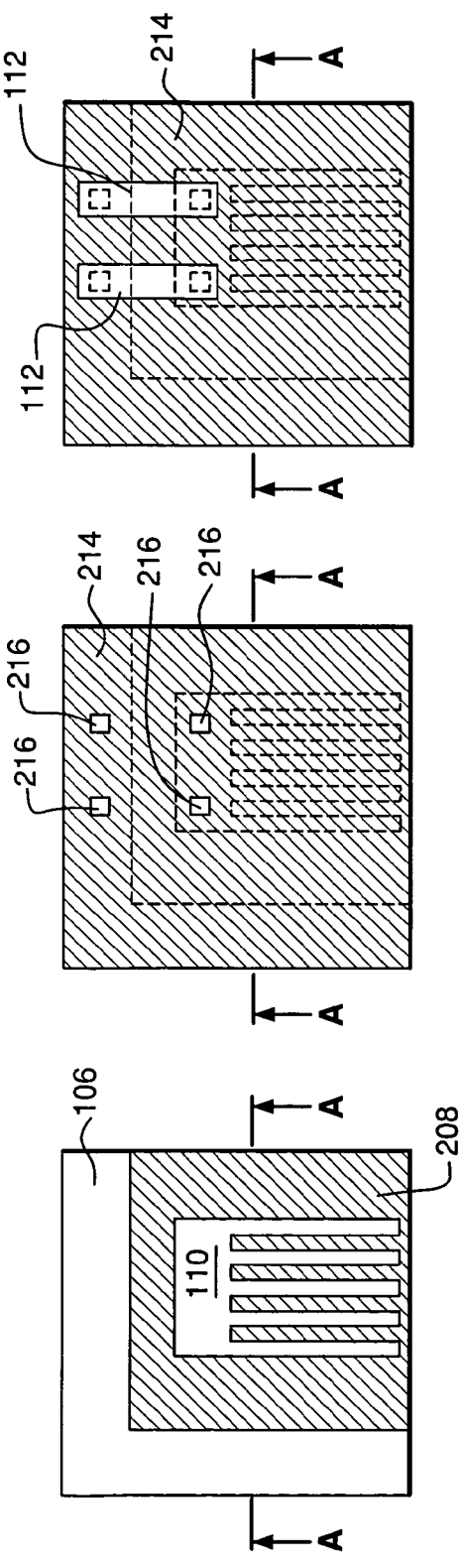

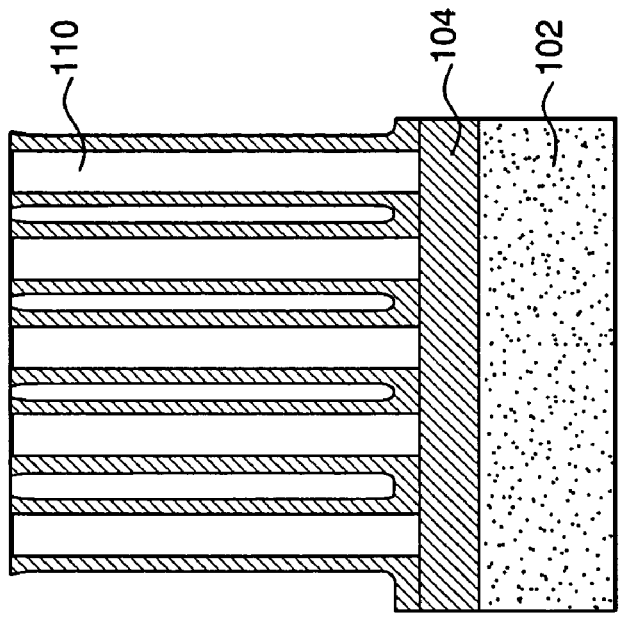
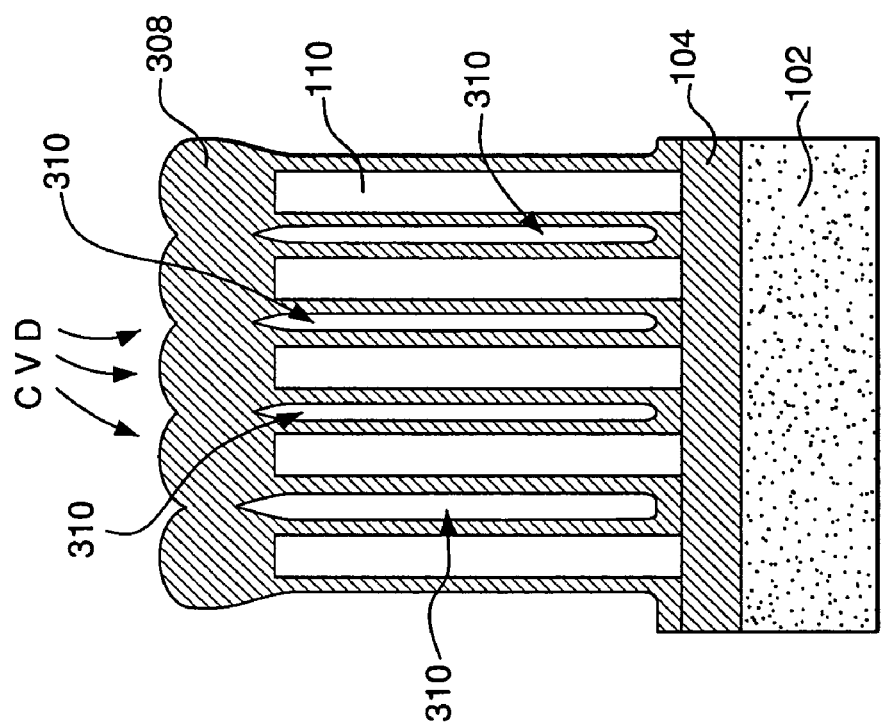
Fig. 3B (prior art)
Fig. 3A (prior art)

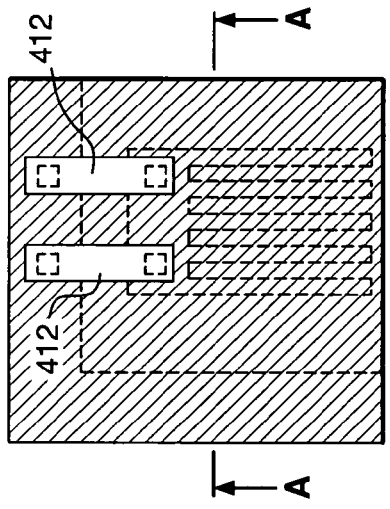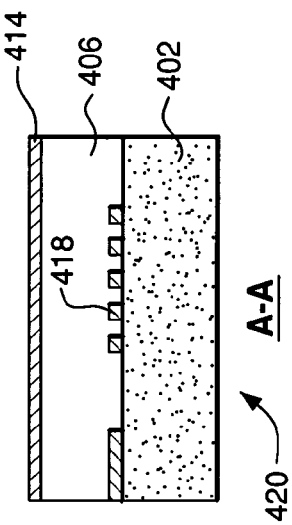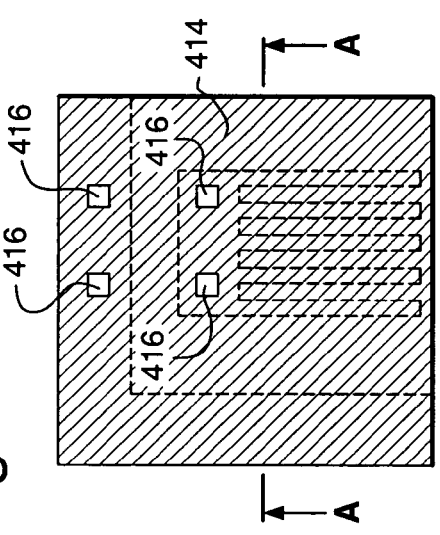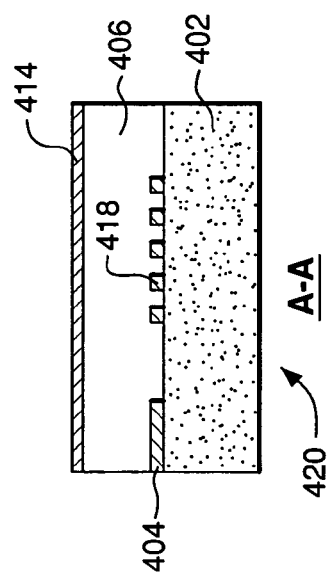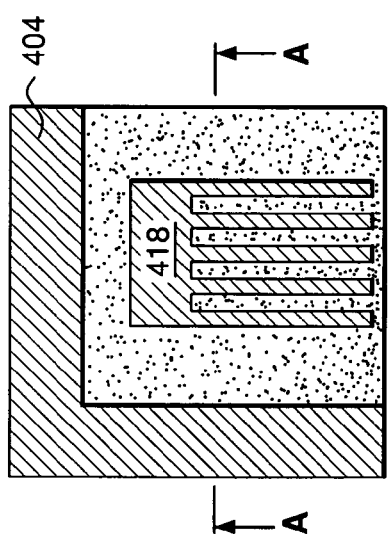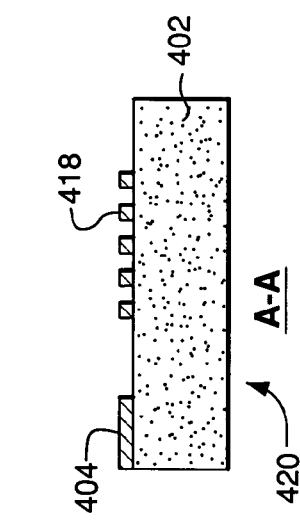

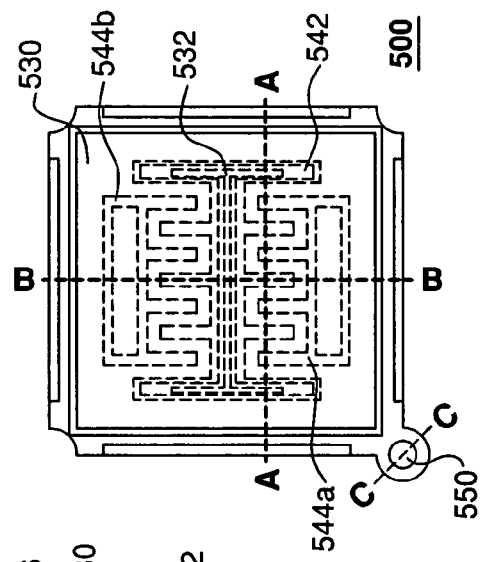
Fig. 5A
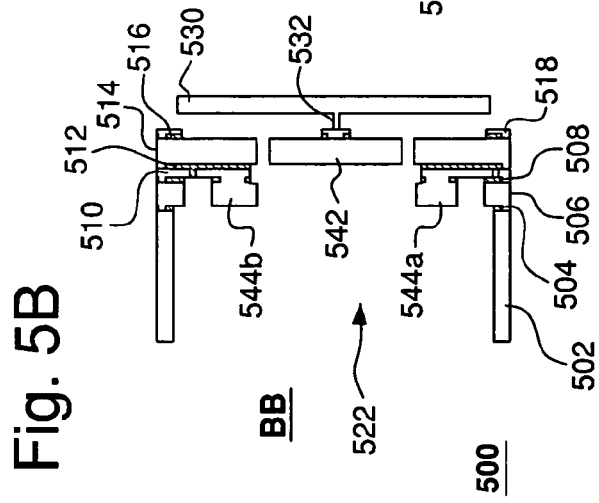
Fig. 5B
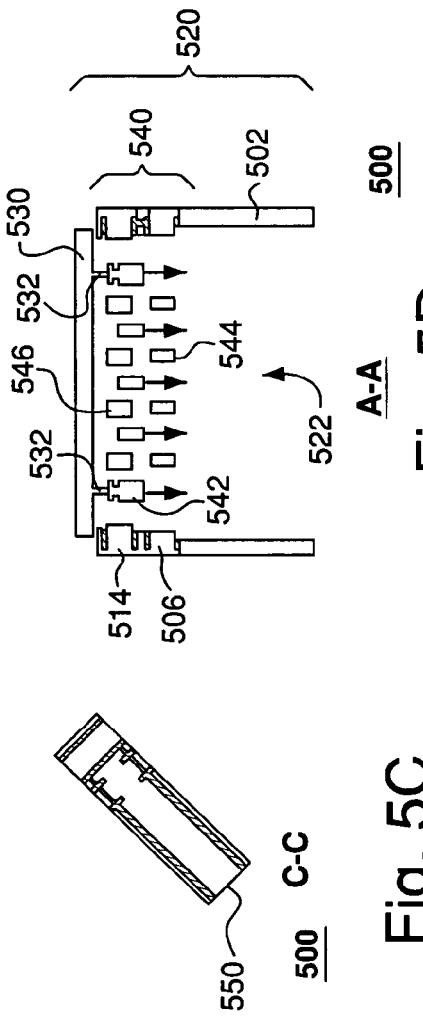
Fig. 5D
Fig. 5C

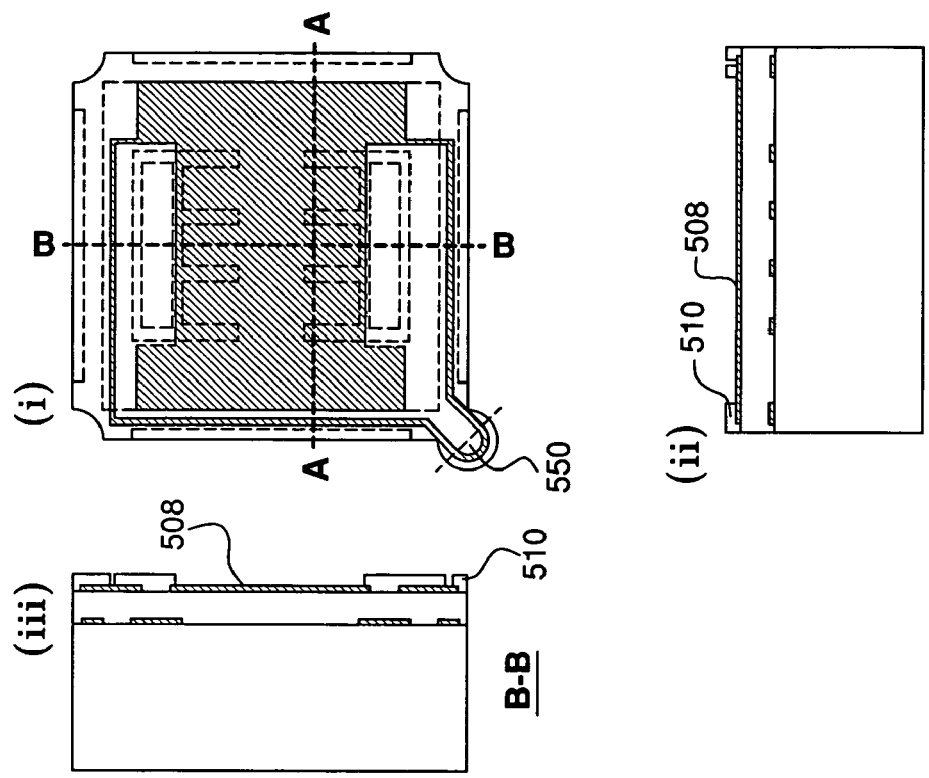
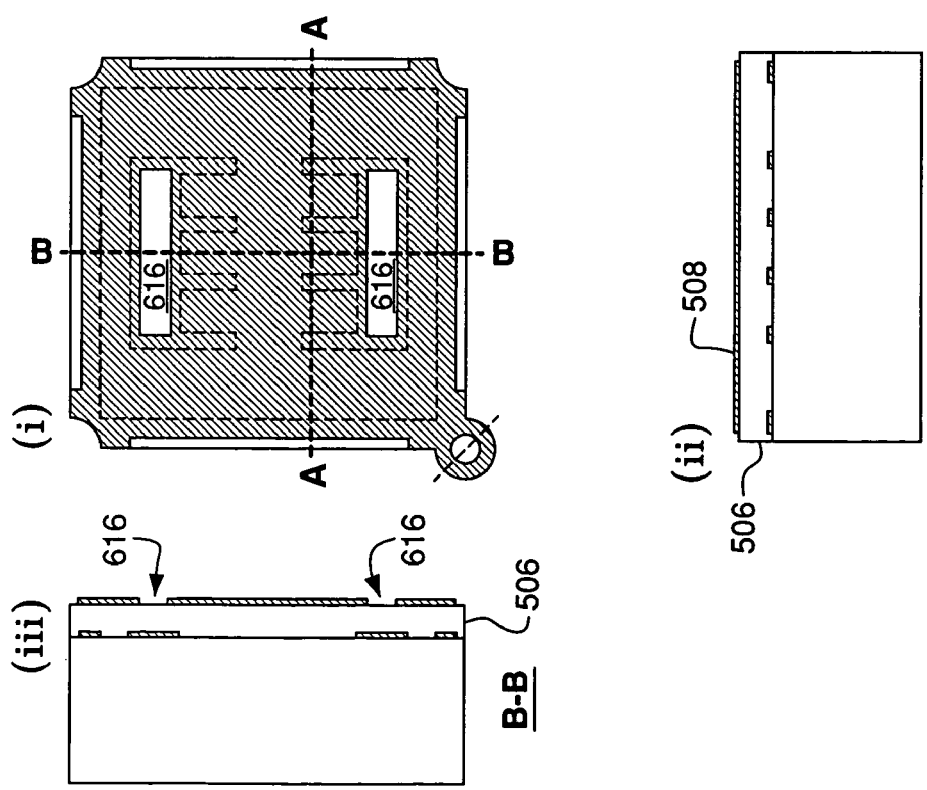
Fig. 6D
Fig. 6C

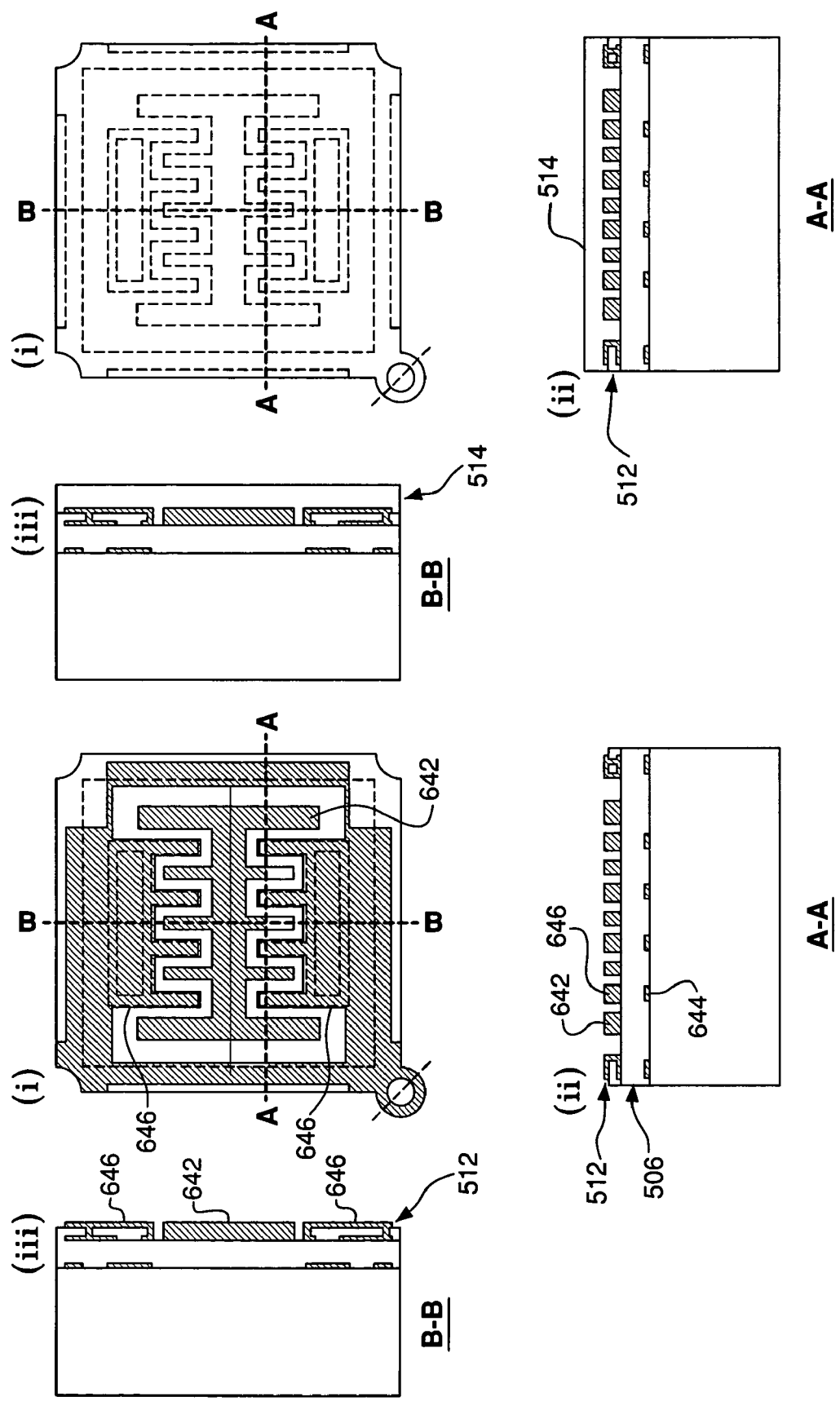

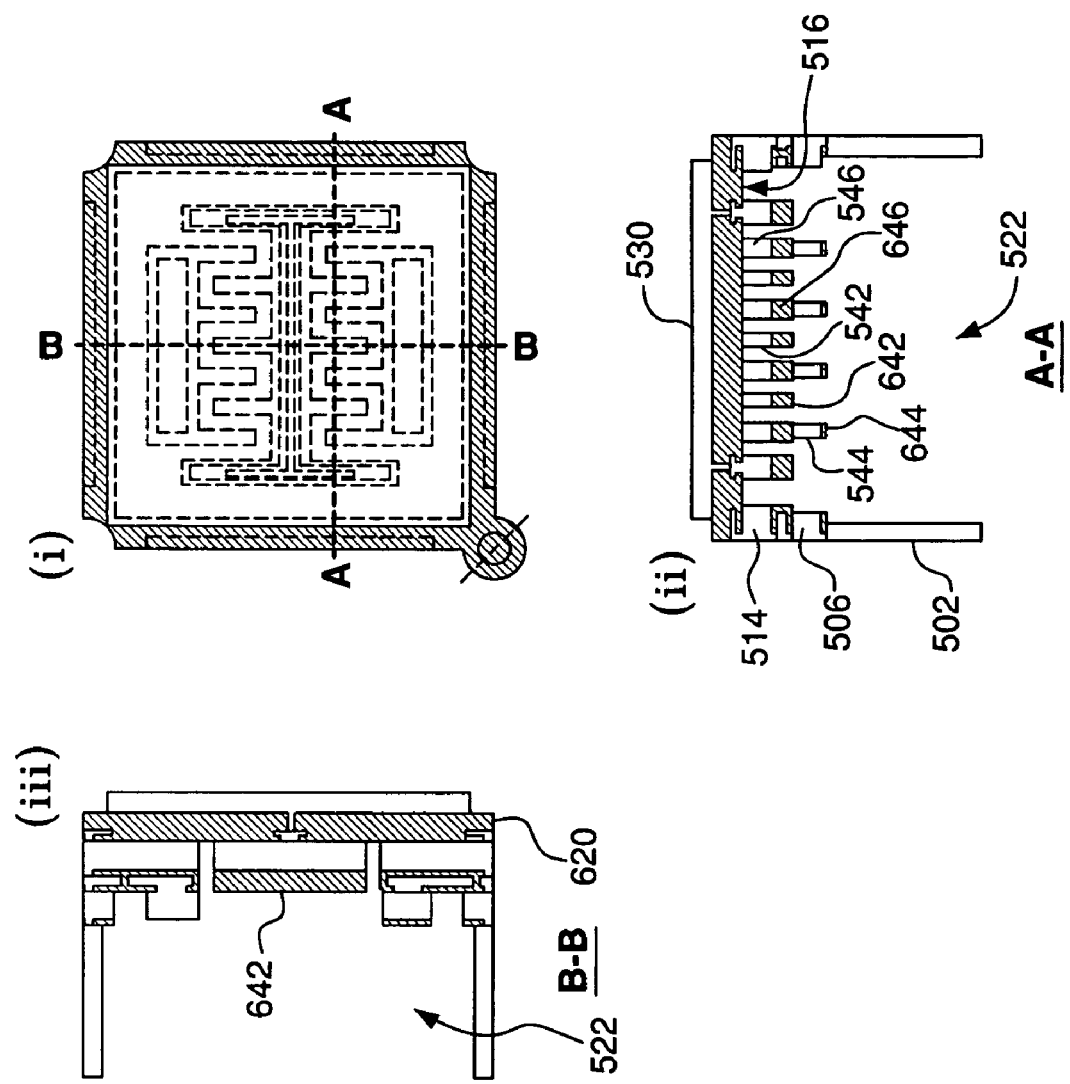

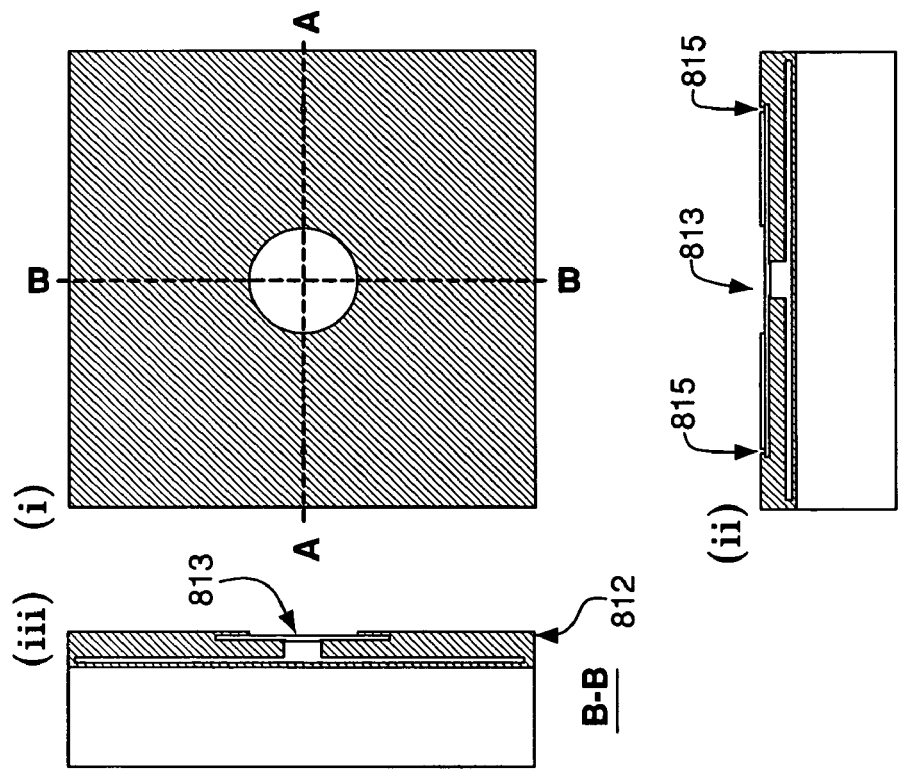
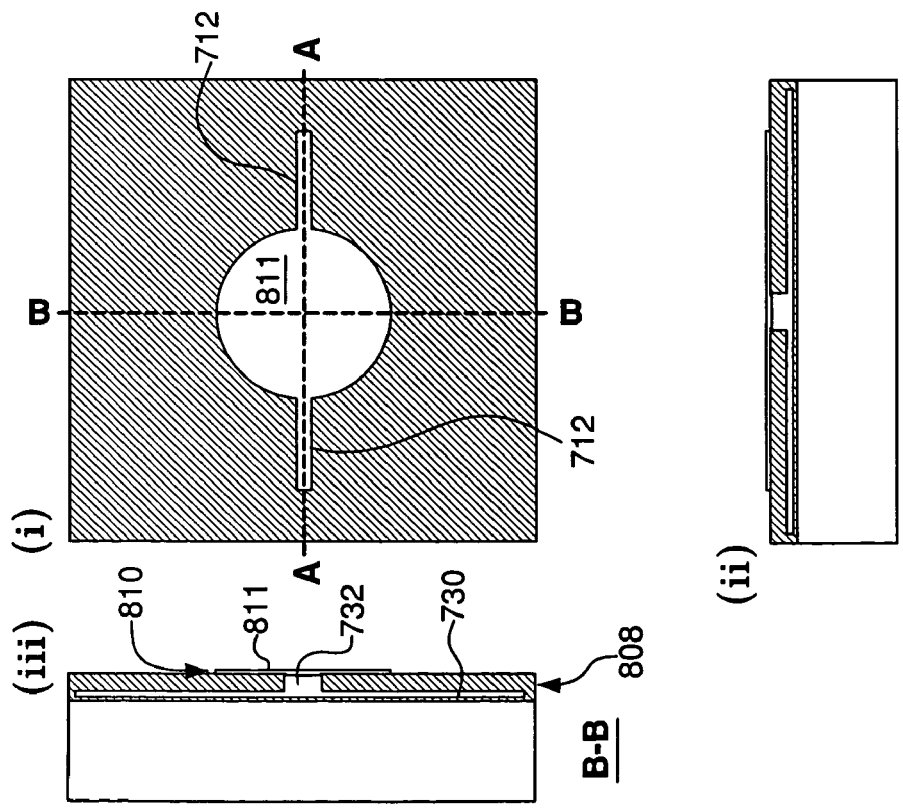
Fig. 8C
Fig. 8D

FABRICATING INTEGRATED DEVICES USING EMBEDDED MASKS

The U.S. Government has a paid-up license in this invention and the right in limited circumstances to require the patent owner to license others on reasonable terms as provided for the terms of Contract No HR0011-04-C-0048 awarded by Coherent Communications Imaging and Targeting—Defense Advanced Research Projects Agency (CCIT-DARPA).

BACKGROUND OF THE INVENTION

1. Field of the Invention

The present invention relates to integrated devices and, more specifically, to methods for fabricating micro-electromechanical systems (MEMS) structures and/or devices.

2. Description of the Related Art

Fabrication of a MEMS device often involves forming structures in one or more relatively thick (e.g., about 10 μm or thicker) layers of (poly)silicon. A typical prior-art method of forming such structures usually includes a sequence of: (1) patterning and etching a thick (poly)silicon layer down to an underlying silicon-oxide, etch-stop layer, which etching produces variously sized voids (some relatively deep and narrow) in the (poly)silicon layer; (2) filling the voids with silicon oxide; and (3) planarizing the surface of the silicon oxide in preparation for the deposition and processing of the subsequent over-layers required to complete the fabrication process of the MEMS device. One significant difficulty associated with the oxide-filling step (i.e., step (2)) is that it often requires multiple deposition, etch-back, annealing, and polishing steps to achieve uniform filling of the voids and appropriate control of local stresses in nascent silicon structures (often having sub-micron dimensions). Excessive local stresses are detrimental because these stresses can lead to fractures, e.g., during the final release procedure, when sacrificial silicon oxide is removed and substantial stresses might occur.

SUMMARY OF THE INVENTION

Problems in the prior art are addressed, in accordance with the principles of the present invention, by a method of fabricating a device using a multi-layered wafer that has an embedded etch mask adapted to map a desired device structure onto an adjacent (poly)silicon layer. Due to the presence of the embedded mask, it becomes possible to delay the etching that forms the mapped structure in the (poly)silicon layer until a relatively late fabrication stage. As a result, flatness of the (poly)silicon layer is preserved for the deposition of any necessary over-layers, which substantially obviates the need for filling the voids created by the structure formation with silicon oxide.

According to one embodiment, the present invention is a method of fabricating an integrated device, comprising: (A) forming an embedded mask in a multi-layer wafer, the mask in contact with one or more layers of the wafer; and (B) etching a portion of the one or more layers from the wafer, wherein the embedded mask protects other one or more portions of the one or more layers from being removed during the etching.

According to another embodiment, the present invention is an integrated device, comprising: (A) a multi-layer wafer having a first side and a second side; (B) a first structure formed in a first layer of the wafer, said first structure having a first outline pattern; and (C) a second structure formed in a second layer of the wafer, said second structure having a second outline pattern, wherein: the wafer has an opening in the first side, which exposes the first and second structures, said opening having a third outline pattern, wherein the third outline pattern substantially encloses the first and second outline patterns; the second layer has a greater offset distance from the first side than the first layer; and the second outline pattern substantially encloses the first outline pattern.

BRIEF DESCRIPTION OF THE DRAWINGS

Other aspects, features, and benefits of the present invention will become more fully apparent from the following detailed description, the appended claims, and the accompanying drawings in which:

FIGS. 3A-B schematically illustrate one problem associated with the fabrication method illustrated in FIG. 2;

FIGS. 4A-J schematically illustrate representative fabrication steps of a fabrication method for a MEMS structure that is analogous to the MEMS structure shown in FIG. 1 according to one embodiment of the invention;

FIGS. 5A-D show top and cross-sectional side views of a MEMS device according to one embodiment of the invention;

FIGS. 6A-K schematically illustrate representative fabrication steps of a fabrication method for the MEMS device shown in FIG. 5 according to one embodiment of the invention;

FIGS. 8A-H schematically illustrate representative fabrication steps of a fabrication method for the MEMS device shown in FIG. 7 according to one embodiment of the invention.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
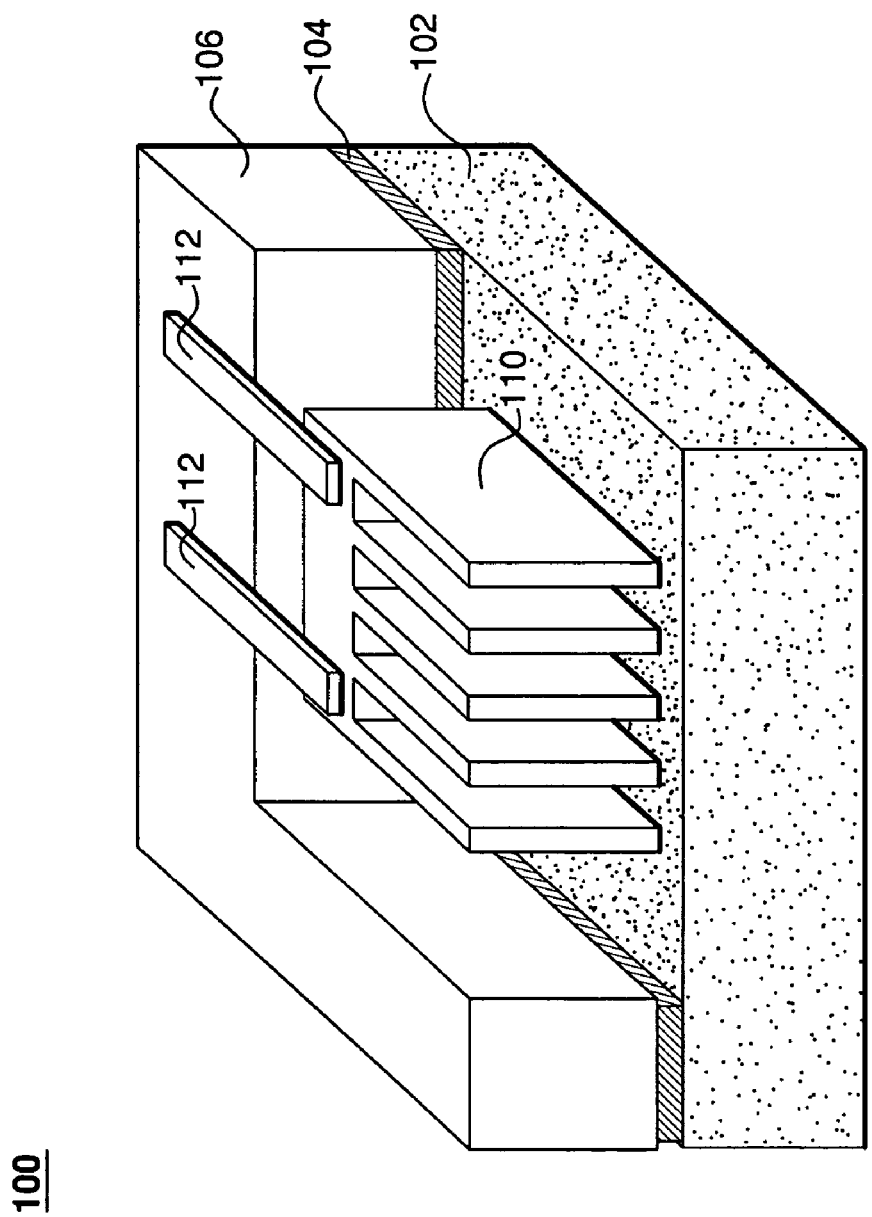
FIG. 1 shows a perspective three-dimensional view of a representative MEMS structure.

FIG. 1 shows a perspective three-dimensional view of a representative MEMS structure 100. More specifically, MEMS structure 100 includes a silicon substrate layer 102, a relatively thin silicon-oxide layer 104 deposited over the substrate layer, and a relatively thick (poly)silicon layer 106 deposited over the oxide layer. MEMS structure 100 further includes a comb-shaped electrode 110 movably connected to layer 106 by a pair of flexible bars (springs) 112. Electrode 110 can, for example, be a part of an electrostatic comb-drive actuator and can move with respect to layers 102, 104, and 106, when the actuator is actuated as known in the art.

Figure 2M:
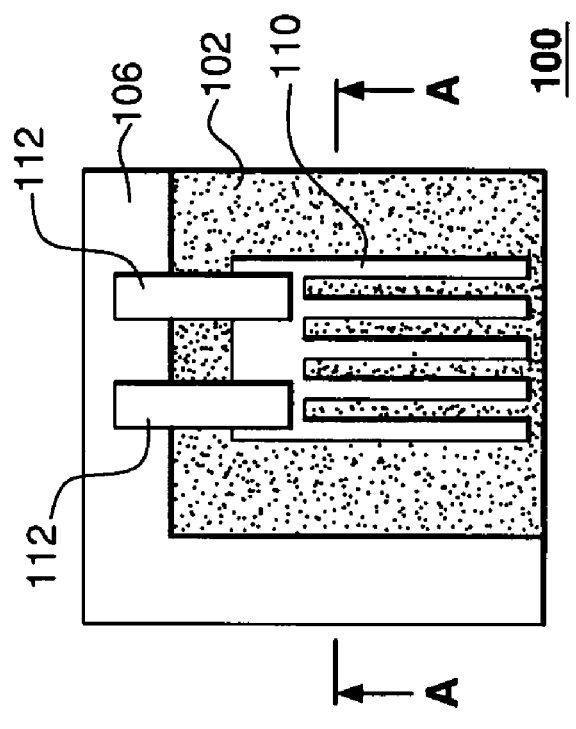
FIGS. 2A-N schematically illustrate representative fabrication steps of a prior-art fabrication method for the MEMS structure shown in FIG. 1.
Figure 2N:
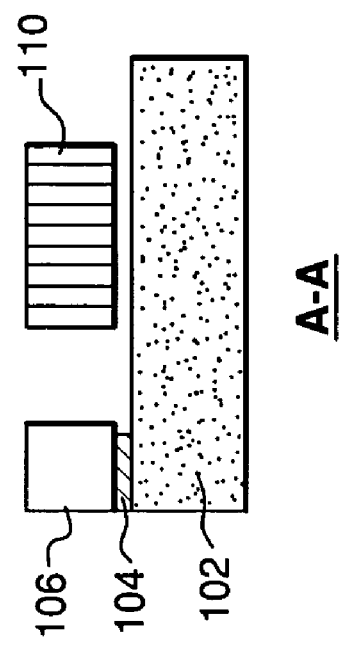

FIGS. 2A-N schematically illustrate representative fabrication steps of a prior-art fabrication method for MEMS structure 100 of FIG. 1. More specifically, FIGS. 2A, 2C, 2E, 2G, 2I, 2K, and 2M show top views of a wafer 220 during those fabrication steps, whereas FIGS. 2B, 2D, 2F, 2H, 2J, 2L, and 2N show the corresponding cross-sectional views along the plane designated AA in the top view figures.

Referring to FIGS. 2A-D, fabrication of MEMS structure 100 begins with wafer 220 having silicon substrate layer 102. Silicon-oxide layer 104 is first deposited over substrate layer 102 (see FIGS. 2A-B), and then (poly)silicon layer 106 is deposited over layer 104 (see FIGS. 2C-D).

Referring to FIGS. 2E-F, (poly)silicon layer 106 is patterned and etched to form electrode 110. At this fabrication stage, electrode 110 is attached to layer 104 (see FIG. 2F), which acts as an etch stop for the etching process.

Referring to FIGS. 2G-H, voids/openings in (poly)silicon layer 106 produced during the formation of electrode 110 are filled with a silicon-oxide mass 208. For the reasons specified in the background section, it is important that mass 208 uniformly fills all voids/openings in layer 106 and, more particularly, the relatively deep and narrow trenches between the teeth of electrode 110. The exposed surface of mass 208 is then polished for the mass to have substantially the same thickness as layer 106.

Referring to FIGS. 2I-L, first, a silicon-oxide layer 214 is deposited over layer 106, electrode 110, and mass 208. Second, openings 216 are formed in layer 214 (see FIG. 2I) to provide access to electrode 110 and appropriate portions of layer 106 for the attachment of flexible bars 112. Finally, flexible bars 112 are formed over layer 214 such that they protrude through openings 216 and attach to electrode 110 and layer 106 (see FIG. 2K).

Referring to FIGS. 2M-N, MEMS structure 100 (see also FIG. 1) is finally formed by removing (etching away) silicon-oxide layer 214, silicon-oxide mass 208, and exposed portions of silicon-oxide layer 104. As a result, portions of layer 104 that attach electrode 110 to substrate layer 102 are removed, thereby releasing the electrode and enabling its motion with respect to the substrate layer. Mass 208 is a "sacrificial" structure because substantially no portion of the mass remains in the final product. Moreover, mass 208 is a planarizing structure because the height of the mass is substantially the same as the height of the adjacent structures, i.e., layer 106 and electrode 110.

FIGS. 3A-B schematically illustrate one possible problem associated with the fabrication method illustrated in FIG. 2. More specifically, FIGS. 3A-B show implementation details for the step of forming mass 208 shown in FIGS. 2G-H. Mass 208 is typically grown using chemical vapor deposition (CVD), during which silicon oxide precipitates on exposed surfaces of layers 104 and 106 and electrode 110. Since the chemicals for the formation of silicon oxide are delivered from the gas phase, a somewhat faster growth occurs at the top portions of wafer 220 compared to that at the bottom portions of the wafer, as illustrated in FIG. 3A. This growth non-uniformity becomes problematic when the volume to be filled with silicon oxide has relatively deep and narrow wells, vias, or trenches such as those defined by the teeth of electrode 110 of MEMS structure 100. More specifically, during the CVD process, the growth non-uniformity causes the deposited silicon oxide to form a fused cap 308 at the top of electrode 110, which results in some sealed cavities 310 between the teeth of the electrode. As a result, the CVD process has to be stopped and wafer 220 has to be polished to remove cap 308 and unseal cavities 310 to expose the unfilled voids, as shown in FIG. 3B. Disadvantageously, with wells, vias, and/or trenches having a depth-width aspect ratio of about 5:1 or greater, the sequence illustrated by FIGS. 3A-B might need to be repeated several times before mass 208 is properly formed.

FIGS. 4A-J schematically illustrate representative fabrication steps of a fabrication method for a MEMS structure 400 according to one embodiment of the invention. More specifically, FIGS. 4A, 4C, 4E, 4G, and 4I show top views of a wafer 420 during those fabrication steps, whereas FIGS. 4B, 4D, 4F, 4H, and 4J show the corresponding cross-sectional views along the plane designated AA in the top view figures. MEMS structure 400 (see FIGS. 4I-J) is capable of performing substantially the same functions as conventional MEMS structure 100 (FIGS. 1 and 2M-N). However, one difference between the new and conventional MEMS structures is the presence of an opening in the substrate layer under the comb-shaped electrode in new MEMS structure (i.e., MEMS structure 400).

Advantageously, the fabrication method illustrated in FIG. 4 does not have an oxide-filling step analogous to that illustrated in FIGS. 2G-H and 3A-B and, as such, substantially avoids the difficulties illustrated in FIG. 3. As explained in more detail below, the method of FIG. 4 (termed a no-oxide-fill (NOF) method) uses an embedded etch mask in the form of a relatively thin (e.g., about 1 µm), patterned silicon-oxide layer to map an appropriate electrode shape onto a relatively thick adjacent (poly)silicon layer and delays etching of that (poly)silicon layer, which etching actually produces the electrode, until a later fabrication stage. As a result, flatness of the (poly)silicon layer is more easily maintained for the deposition of any necessary over-layers, thereby substantially eliminating the need for the formation of a planarizing, sacrificial structure analogous to mass 208 of FIG. 2.

Referring to FIGS. 4A-B, fabrication of MEMS structure 400 begins with wafer 420 having a silicon substrate layer 402. First, a silicon-oxide layer 404 is deposited over substrate layer 402. Then, layer 404 is patterned and etched to form a mask 418 that has a shape corresponding to that of a (not-yet-formed) comb-shaped electrode 410 (shown, e.g., in FIGS. 4I-J).

Referring to FIGS. 4C-D, a (poly)silicon layer 406 is deposited over mask 418 and layer 404 as shown in FIG. 4D. Because mask 418 and layer 404 are relatively thin (e.g., about 1 µm), the problem illustrated in FIGS. 3A-B does not present itself during the growth of layer 406. After the deposition of layer 406, mask 418 becomes buried under that layer. Mask 418 is an embedded etch mask that maps the appropriate comb shape onto layer 406. In general, the term "an embedded mask" can designate a mask that either is fully encapsulated by the adjacent layers or, alternatively, has some uncovered edges or segments. In contrast, the term "a buried mask" designates a mask that is fully encapsulated by the adjacent layers. In certain embodiments, mask 418 or its one or more portions might remain in the final structure.

Referring to FIGS. 4C-F, a silicon-oxide layer 414 is deposited over layer 406 (see FIG. 4D). Then, openings 416 are formed in layer 414 (see FIG. 4C) to provide access to appropriate portions of layer 406 for the attachment of flexible bars 412. Finally, flexible bars 412 are formed over layer 414 such that they protrude through openings 416 and attach to layer 406 (see FIG. 4E).

Figure 4G:
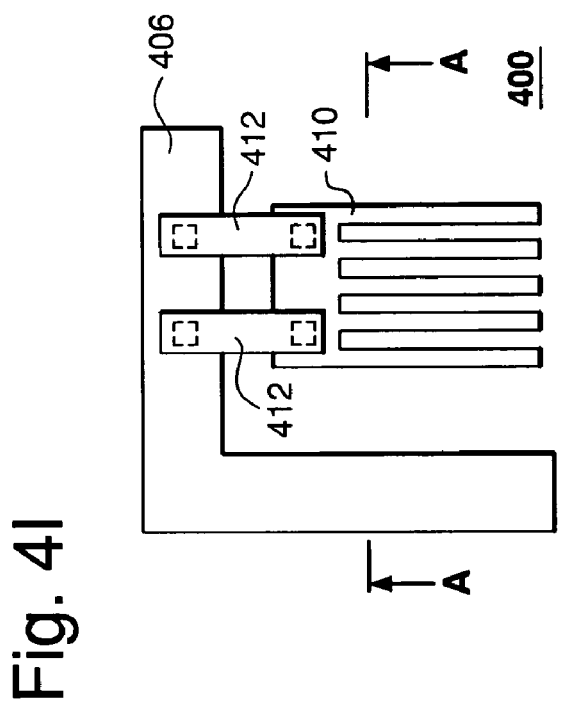
Figure 4I:
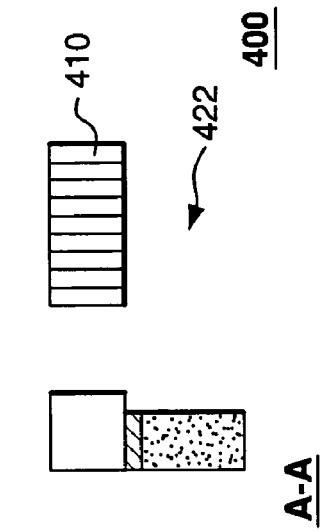
Figure 4H:
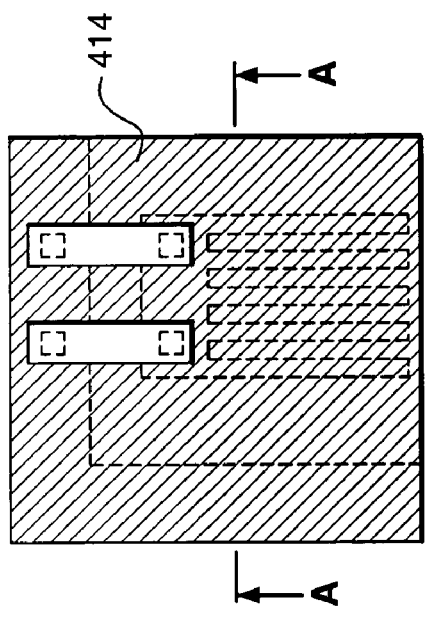

Referring to FIGS. 4G-H, first, substrate layer 402 is masked to define boundaries of an opening 422 in the substrate layer under mask 418. Then, wafer 420 is flipped and a backside DRIE (deep reactive ion) etch is performed to create opening 422 in substrate layer 402. After opening 422 is created in substrate layer 402, the DRIE etch continues to remove the exposed silicon (i.e., portions that are not protected by mask 418) from layer 406. However, due to the presence of mask 418, some portions of layer 406 are protected from the DRIE etching. These portions remain in place, thereby forming electrode 410 as shown in FIG. 4H. Note that layer 414 acts as a stop for the backside dry etch.

Figure 4J:
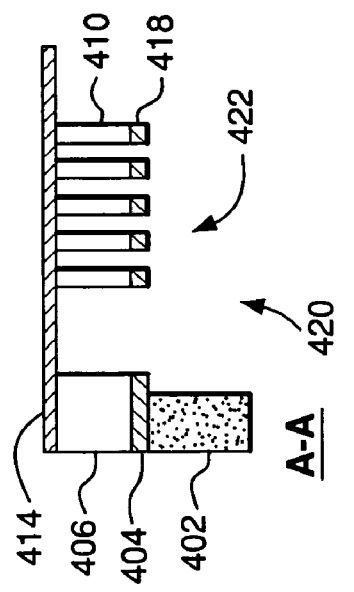

Referring to FIGS. 4I-J, MEMS structure 400 is formed in wafer 420 by removing (etching away) mask 418 and layer 414. As a result, electrode 410 is released and becomes suspended over opening 422 by flexible bars 412. Comparing FIGS. 4I-J with FIGS. 2M-N, respectively, one finds that MEMS structure 400 is substantially similar to MEMS structure 100, with a major difference between the two structures being the presence of opening 422 in the substrate layer of MEMS structure 400. Advantageously, because the formation of electrode 410 having relatively deep and narrow trenches was delayed until the step illustrated in FIGS. 4G-H, the method of FIG. 4 does not need and does not have an oxide-filling step analogous to that illustrated in FIGS. 2G-H and 3A-B.

FIGS. 5A-D show top and cross-sectional side views of a MEMS device 500 according to one embodiment of the invention. More specifically, FIG. 5A shows a top view of device 500, whereas FIGS. 5B-D show cross-sectional side views along the planes designated BB, CC, and AA, respectively, in FIG. 5A. Device 500 is fabricated using a multi-layered wafer 520 having, inter alia, a silicon substrate layer 502, silicon-oxide layers 504, 508, 512, and 516, and (poly) silicon layers 506, 510, 514, and 518. Device 500 has a movable plate 530 that can serve, e.g., as a segment of a segmented mirror in an adaptive optical element. Plate 530 is mounted, by means of an H-shaped support structure 532, on a comb-shaped portion 542 of an out-of-plane comb drive 540. Comb-shaped portion 542 is movably suspended by one or more springs (not shown in FIG. 5) over an opening 522 in wafer 520 and can move with respect to substrate layer 502, e.g., as shown by the arrows in FIG. 5D. Comb drive 540 has two additional comb-shaped portions 544a-b interleaved with comb-shaped portion 542. Portions 542 and 544 are formed in different (poly)silicon layers, i.e., layers 514 and 506, respectively, and as such have different offset distances from substrate layer 502. Unlike portion 542, which is movably connected to substrate layer 502, each of portions 544a-b is fixedly connected to substrate layer 502 (see FIG. 5B).

Wafer 520 has a through-wafer via 550 (see FIG. 5C) that is electrically connected to each of portions 544a-b, while being electrically isolated from the rest of the device structure. As a result, portions 544a-b can be electrically biased with respect to portion 542, e.g., by the application of a voltage differential between via 550 and layer 514. When applied, the voltage differential generates an electrostatic attractive force between portions 542 and 544, which causes the former to move with respect to the latter as shown in FIG. 5D, thereby generating a piston-like displacement for plate 530. When the voltage differential is removed the one or more springs attached to portion 542 return it to the initial rest position shown in FIG. 5B.

FIGS. 6A-K schematically illustrate representative fabrication steps of a fabrication method for MEMS device 500 according to one embodiment of the invention. More specifically, each of FIGS. 6A-K shows three views labeled (i), (ii), and (iii), respectively. Each view (i) is a top view of wafer 520 at the corresponding fabrication step, whereas views (ii) and (iii) are the corresponding cross-sectional side views along the planes designated AA and BB in the top view figure. The method of FIG. 6 is similar to the method of FIG. 4 in that it is an NOF method. However, one difference between the methods of FIGS. 4 and 6 is that the latter utilizes two sets of embedded masks corresponding to different, relatively thick silicon layers (e.g., layers 506 and 514). As a result, a single DRIE etch in the method of FIG. 6 obviates two different oxide-filling steps, each analogous to that illustrated in FIGS. 2G-H and 3A-B.

Figures 6A, 6B:
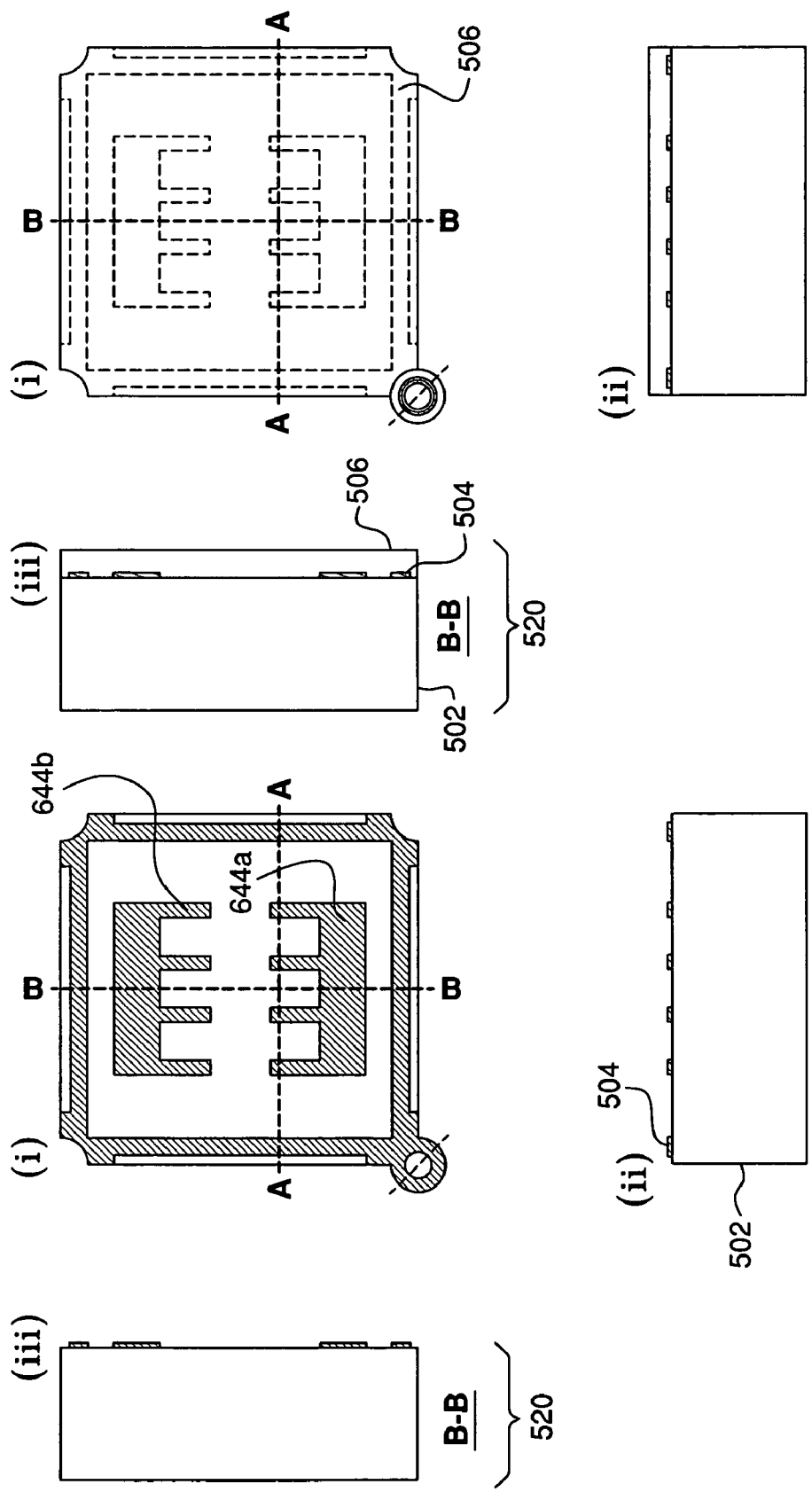

Referring to FIGS. 6A(i)-(iii), fabrication of MEMS device 500 begins with wafer 520 having silicon substrate layer 502. First, silicon-oxide layer 504 is deposited over substrate layer 502. Then, layer 504 is patterned and etched to form a mask 644 that has a shape corresponding to that of (not-yet-formed) comb-shaped portions 544 (see FIG. 5).

Referring to FIGS. 6B(i)-(iii), (poly)silicon layer 506 is deposited over mask 644 and layers 502 and 504. After the deposition of layer 506, mask 644 becomes buried under that layer. Mask 644 is a first embedded etch mask in wafer 520 that maps comb-shaped portions 544 onto layer 506.

Referring to FIGS. 6C(i)-(iii), silicon-oxide layer 508 is deposited over layer 506. Then, openings 616 are formed in layer 508 (see FIG. 6C(iii)) to open up appropriate portions of layer 506 for the formation of electrical leads and mechanical support structures for comb-shaped portions 544.

Referring to FIGS. 6D(i)-(iii), relatively thin (poly)silicon layer 510 is deposited over openings 616 and layer 508. Layer 510 is patterned and etched to create electrical leads connecting (not-formed-yet) comb-shaped portions 544 to via 550 and to form mechanical support structures for those comb-shaped portions.

Referring to FIGS. 6E(i)-(iii), silicon-oxide layer 512 is deposited over layers 508 and 510. Layer 510 is patterned and etched to form: (1) a mask 642 that has a shape corresponding to that of (not-yet-formed) comb-shaped portion 542 (see also FIG. 5) and (2) a sacrificial insert 646 that has a shape corresponding to that of imbedded mask 644. One purpose of sacrificial insert 646 is to create an electrical break in the DRIE-etch "shadow" cast by mask 644 onto layer 506 and layer 514 (to be deposited later). When sacrificial insert 646 is removed during the final release step of the fabrication process (see FIG. 6K(ii)), it creates an isolating gap between comb-shaped portions 544 formed in layer 506 and similarly shaped structures 546 formed in layer 514 (see also FIG. 5). Since structures 546 are electrically connected to layer 514, these structures have the same electrostatic potential as comb-shaped portion 542 and, as such, do not contribute to or interfere with the generation of an electrostatic attractive force in comb drive 540.

In one embodiment, sacrificial insert 646 and therefore structures 546 have an outline pattern that is substantially the same as the outline pattern of mask 644 and comb-shaped portions 544. Herein, the term "outline pattern" designates the shape of an orthogonal projection of the corresponding structure (e.g., the insert, mask, or portion) onto the substrate plane. In an alternative embodiment, the outline pattern of sacrificial insert 646 and structures 546 can be larger than the outline pattern of mask 644 and comb-shaped portions 544 such that the former outline pattern encloses the latter outline pattern. However, it is preferred that structures 546 do not interfere with the motion of comb-shaped portion 542. As a result, sacrificial insert 646 is shaped such that its outline pattern does not overlap with the outline pattern of mask 642 and comb-shaped portion 542.

Referring to FIGS. 6F(i)-(iii), (poly)silicon layer 514 is deposited over mask 642, sacrificial insert 646, and layer 512. After the deposition of layer 514, mask 642 becomes buried under that layer. Mask 642 is a second embedded etch mask in wafer 520 that maps comb-shaped portions 542 onto layer 514.

Figure 6H:
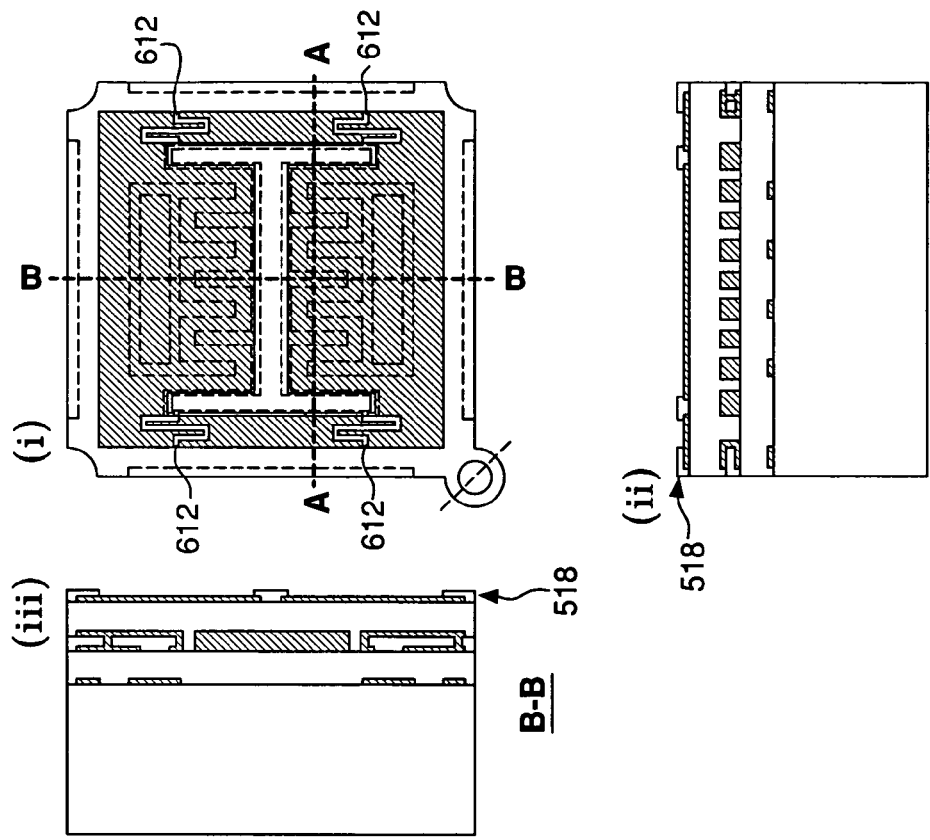
Figure 6G:
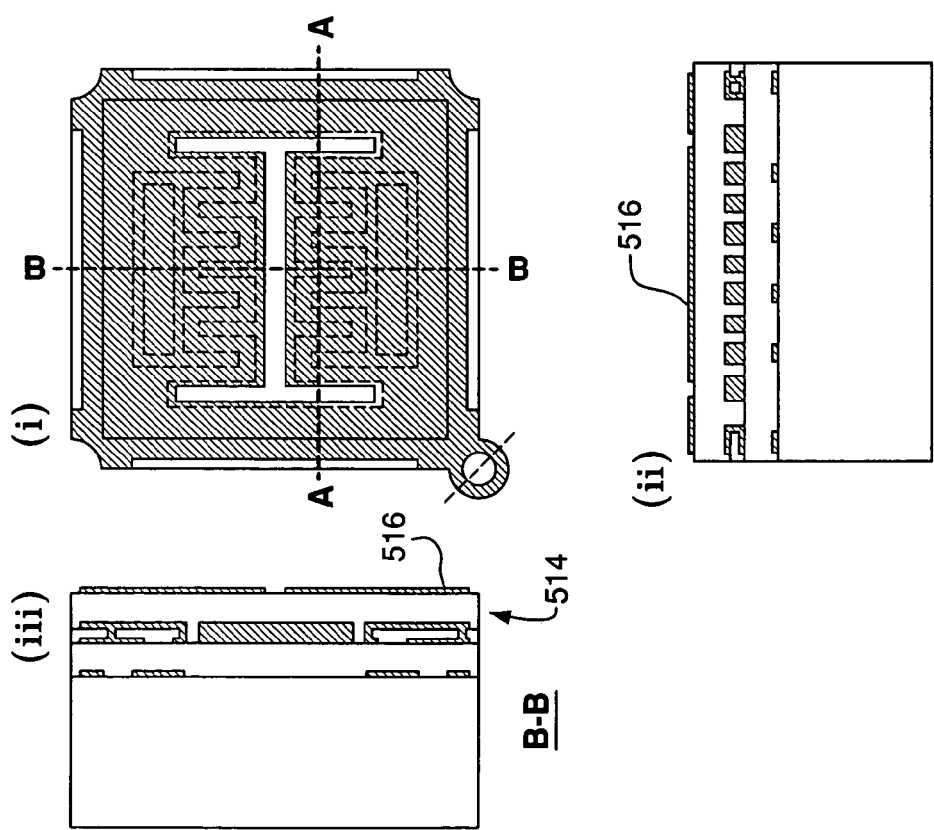

Referring to FIGS. 6G(i)-(iii), silicon-oxide layer 516 is deposited over layer 514. Layer 516 is patterned and etched to open up appropriate portions of layer 514 for the formation of mechanical support structures for comb-shaped portion 542 and plate 530. Silicon-oxide layer 516 will act as an etch stop for the DRIE etch that will form comb-shaped portions 542 and 544 in layers 514 and 506, respectively (see also FIG. 6K).

Referring to FIGS. 6H(i)-(iii), relatively thin (poly)silicon layer 518 is deposited over layer 516. Layer 518 is patterned and etched to form springs 612 and the base of H-shaped support structure 532.

Figure 6J:
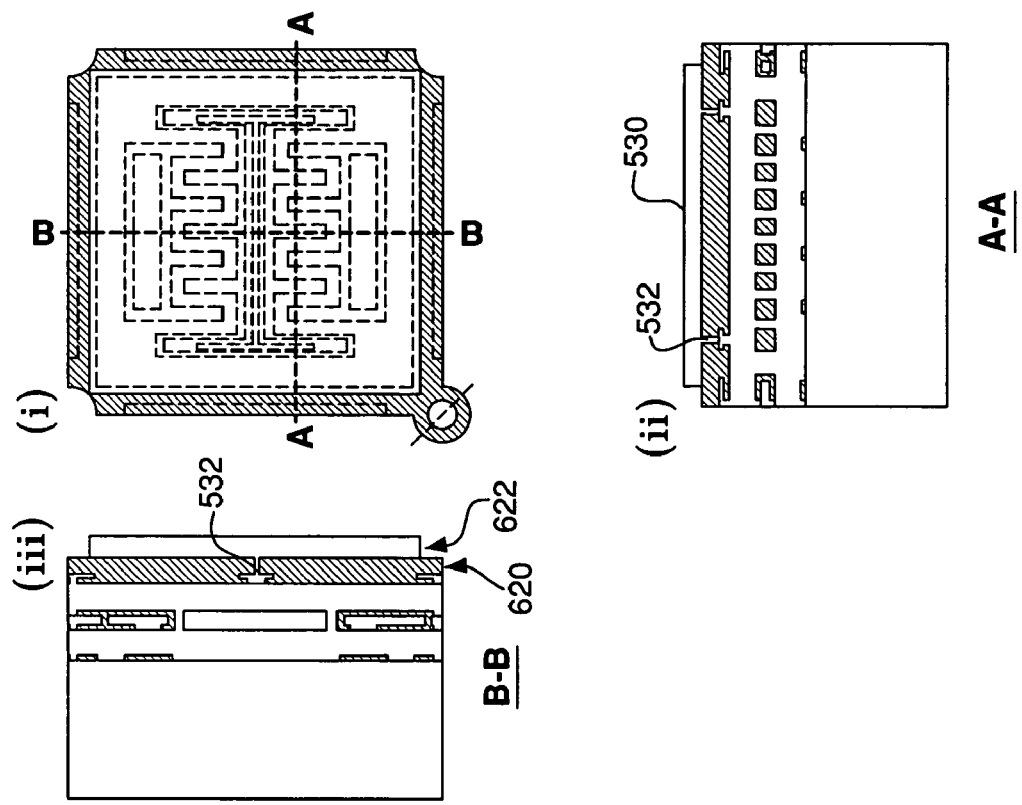
Figure 6I:
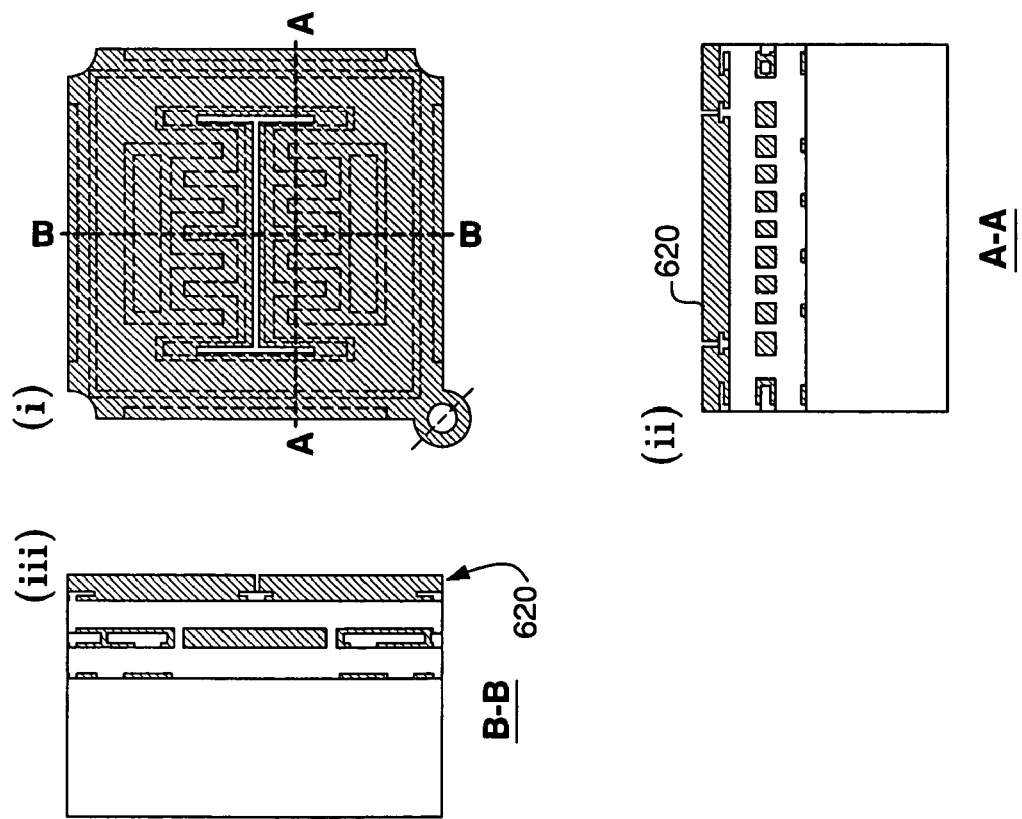

Referring to FIGS. 6I(i)-(iii), a silicon-oxide layer 620 is deposited over layer 518, springs 612, and the base of H-shaped support structure 532. The thickness of layer 620 determines the maximum travel distance toward substrate layer 502 for (not-yet-formed) plate 530. Layer 620 is patterned and etched to form grooves that define H-shaped support structure 532.

Referring to FIGS. 6J(i)-(iii), the grooves in layer 620 are filled with (poly)silicon to form H-shaped support structure 532 and a (poly)silicon layer 622 is deposited over layer 620 and the H-shaped support structure. Layer 620 is then patterned and etched to form plate 530.

Referring to FIGS. 6K(i)-(iii), first, substrate layer 502 is masked to define boundaries of opening 522 in the substrate layer under masks 642 and 644. To enable the exposure through opening 522 of masks 642 and 644, sacrificial insert 646, comb-shaped portions 542 and 544, and structures 546, opening 522 has an outline pattern that substantially encloses the outline patterns of the masks, the sacrificial insert, the comb-shaped portions, and the structures. Then, a backside DRIE etch is performed to create opening 522 in substrate layer 502. After opening 522 is created in substrate layer 502, the etch continues further to remove the exposed silicon from layer 506. However, due to the presence of mask 644, portions of layer 506 that are in the etch "shadow" of that mask are protected from the etching. These portions remain in place, thereby forming comb-shaped portions 544, as shown in FIG. 6K(ii). After portions 544 are formed in layer 506, the DRIE etch continues further to remove the exposed silicon from layer 514. However, due to the presence of masks 642 and 644 and sacrificial insert 646, portions of layer 514 that are in the etch "shadow" of the masks and the sacrificial insert are protected from the etching. These portions remain in place, thereby forming comb-shaped portion 542 and structures 546 as shown in FIG. 6K(ii). Note that layer 516 acts as an etch stop for the etch. MEMS device 500 is formed in wafer 520 by removing (etching away) masks 642 and 644, sacrificial insert 646, and layer 620 (see also FIG. 5). As a result, comb-shaped portion 542 and H-shaped support structure 532 and plate 530 connected to that comb-shaped portion are released for motion with respect to the stationary parts of device 500, e.g., substrate layer 502, as shown in FIG. 5D.

Figure 7A:
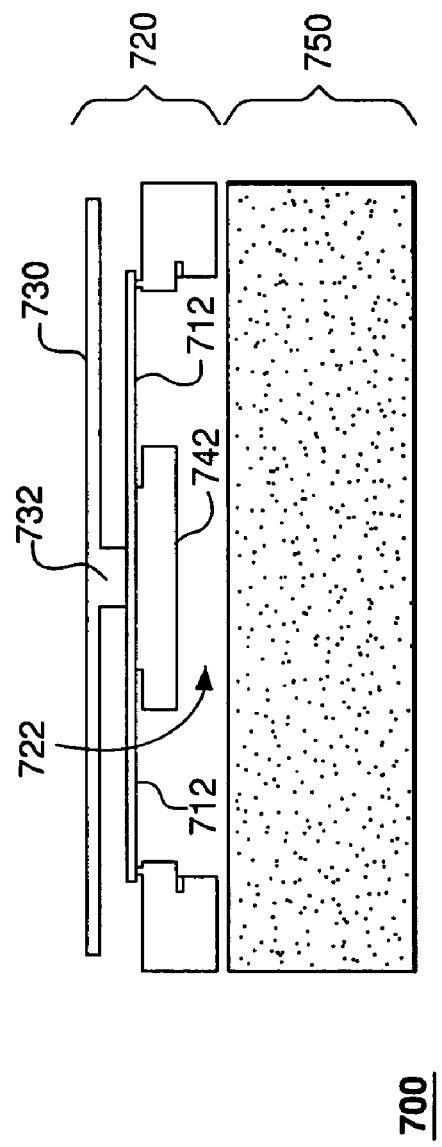
FIGS. 7A-B show cross-sectional side views of a MEMS device according to another embodiment of the invention.
Figure 7B:
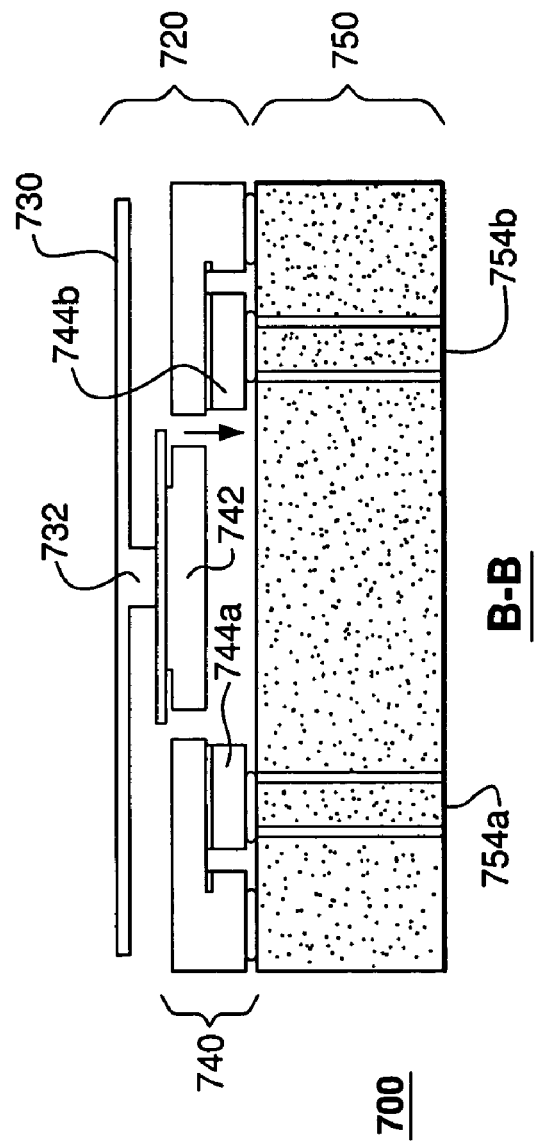

FIGS. 7A-B show two cross-sectional side views of a MEMS device 700 according to another embodiment of the invention. More specifically, FIGS. 7A-B show cross-sectional side views along two orthogonal planes designated AA and BB, respectively. Device 700 is similar to device 500 of FIGS. 5 and 6 in that it can serve, e.g., as a pixel of a segmented mirror in an adaptive optical element. However, one difference between devices 500 and 700 is that the former is a monolithic device formed using a single wafer, while the latter is fabricated by bonding together two different wafers, i.e., a wafer 720 having a movable plate 730 and a wafer 750 having electrical leads 754a-b for stationary electrodes 744a-b, respectively, of an out-of-plane, fringe-field motion actuator 740 coupled to the movable plate. Another difference between devices 500 and 700 is that, in addition to piston-like motion of the movable plate, the latter device can also tilt its movable plate.

Plate 730 is mounted, by means of a support column 732, on a movable electrode 742 of actuator 740. Movable electrode 742 is movably suspended by springs 712 over an opening 722 in wafer 720 and can move with respect to the stationary part of wafer 720 (having, e.g., electrodes 744a-b). Each of electrodes 744a-b is electrically isolated from electrode 742 and the rest of the device structure in wafer 720. As a result, each of electrodes 744a-b can be electrically biased with respect to (typically grounded) electrode 742, e.g., by applying an appropriate bias voltage to the corresponding electrical lead 754. When applied, the bias voltage causes electrode 742 to move with respect to electrodes 744 as indicated by an arrow in FIG. 7B, thereby generating a displacement for plate 730. When equal bias voltages are applied to electrodes 744a-b, actuator 740 generates a piston-like displacement for plate 730. When different bias voltages are applied to electrodes 744a-b, actuator 740 generates a combination of a piston-like displacement and rotation (tilt) for plate 730. When the bias voltages are removed, springs 712 return electrode 742 and plate 730 to their initial rest positions. Additional details on the structure and operation of MEMS devices that are similar to device 700 can be found, e.g., in commonly owned U.S. patent application Ser. Nos. 10/395,362 (filed on Mar. 24, 2003) and Ser. No. 10/772,847 (filed on Feb. 5, 2004), the teachings of both of which are incorporated herein by reference.

FIGS. 8A-H schematically illustrate representative fabrication steps of a fabrication method for MEMS device 700 according to one embodiment of the invention. More specifically, each of FIGS. 8A-H shows three views labeled (i), (ii), and (iii), respectively. Each view (i) is a top view of wafer 720 at the corresponding fabrication step, whereas views (ii) and (iii) are the corresponding cross-sectional side views along the planes designated AA and BB in the top view. The method of FIG. 8 is similar to the methods of FIGS. 4 and 6 in that it is an NOF method. However, one difference between the methods of FIGS. 6 and 8, is that the former method realizes a bottom-to-top fabrication approach, wherein the movable plate is formed close to the end of the fabrication process, whereas the latter method realizes a top-to-bottom fabrication approach, wherein the movable plate is formed relatively early in the fabrication process. In addition, the methods of FIGS. 6 and 8 are different in that, in the former method, the embedded mask(s) work during backside etching while, in the latter method, the embedded mask works during frontside etching.

Figure 8B:
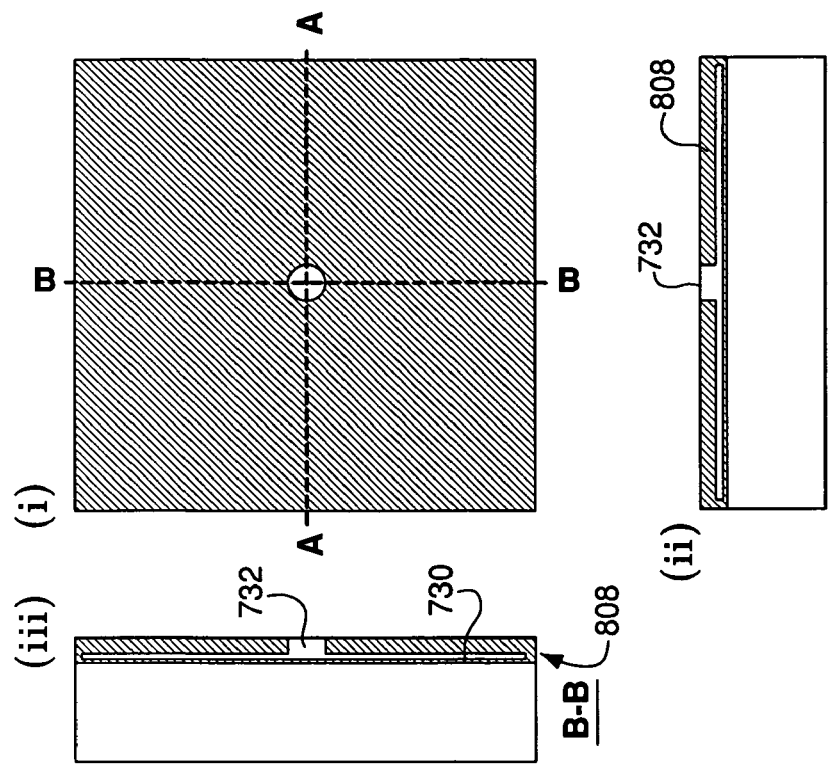
Figure 8A:
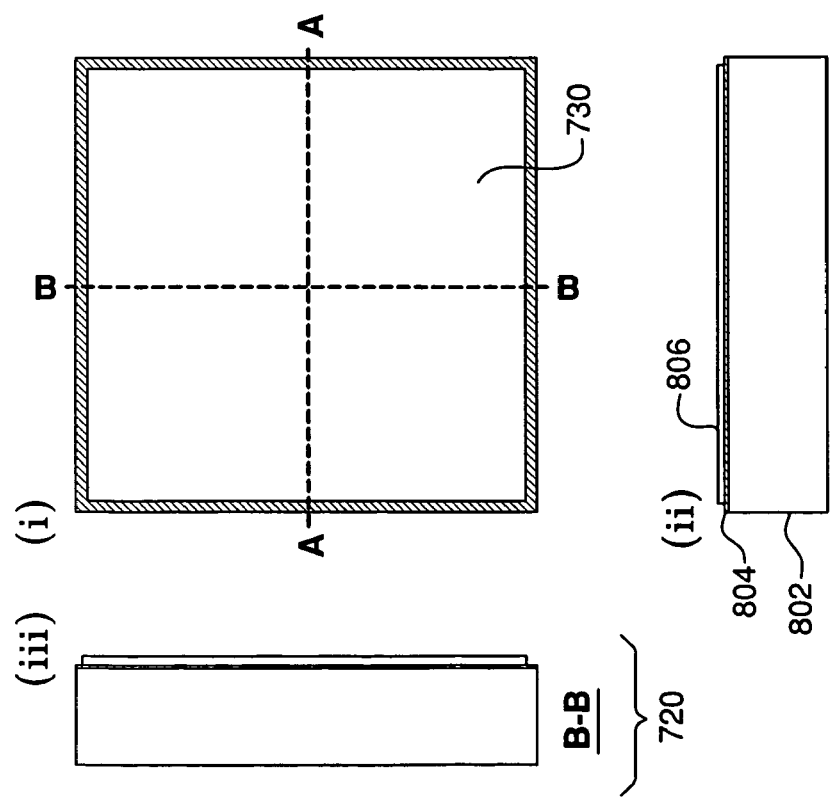

Referring to FIGS. 8A(i)-(iii), fabrication of MEMS device 700 begins with silicon-on-insulator (SOI) wafer 720 having a silicon substrate layer 802, a relatively thin silicon-oxide layer 804, and a silicon overlayer 806. Layer 806 is patterned and etched to form plate 730 (see also FIG. 7). As explained in more detail below, actuator 740 and other support structures for plate 730 are formed using the layers of material that are deposited over silicon overlayer 806. Layers 802 and 804 are ultimately sacrificed (completely removed) at the end of the fabrication process to release plate 730.

Referring to FIGS. 8B(i)-(iii), first, a silicon-oxide layer 808 is deposited over plate 730. Then, a via that defines support column 732 is formed in layer 808. Finally, the via is filled with (poly)silicon to form support column 732.

Referring to FIGS. 8C(i)-(iii), a relatively thin (poly)silicon layer 810 is deposited over layer 808 and support column 732. Layer 810 is patterned and etched to form springs 712 and a support disk 811 connected to support column 732. Support disk 811 serves as an attachment platform for (not-yet-formed) movable electrode 742.

Referring to FIGS. 8D(i)-(iii), a silicon-oxide layer 812 is deposited over springs 712, support disk 811, and layer 810. Then, a central via 813 and side vias 815 are formed in layer 812 to open up appropriate portions of support disk 811 and springs 712, respectively, for the connection of subsequent silicon structures to the support disk and springs.

Figure 8F:
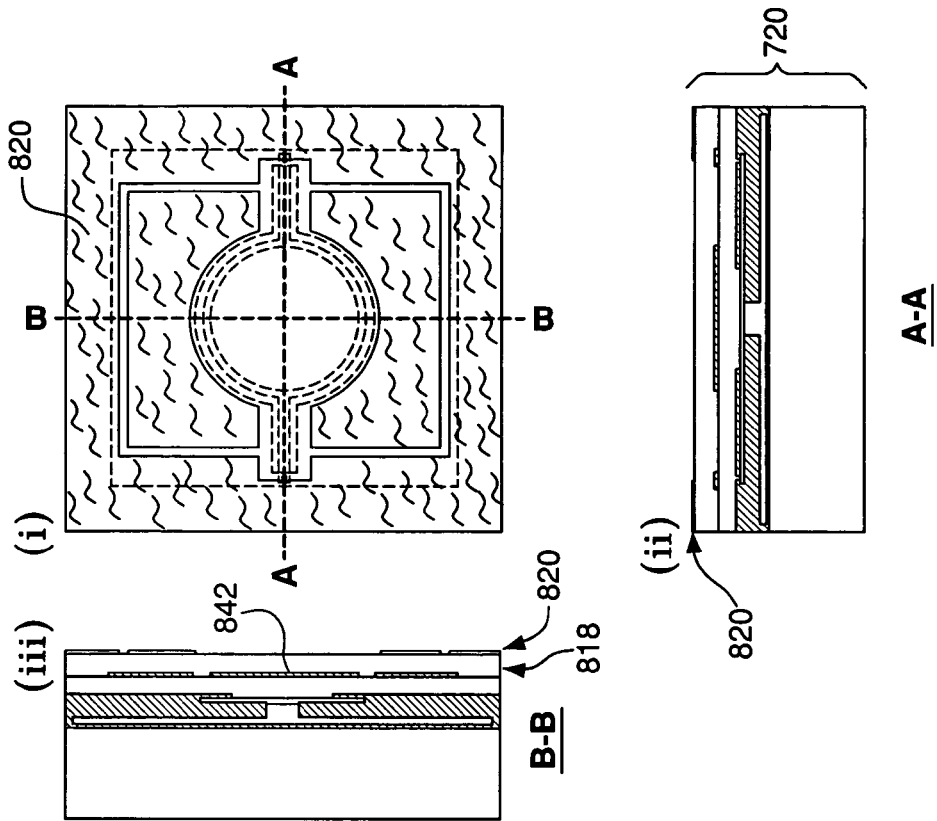
Figure 8E:
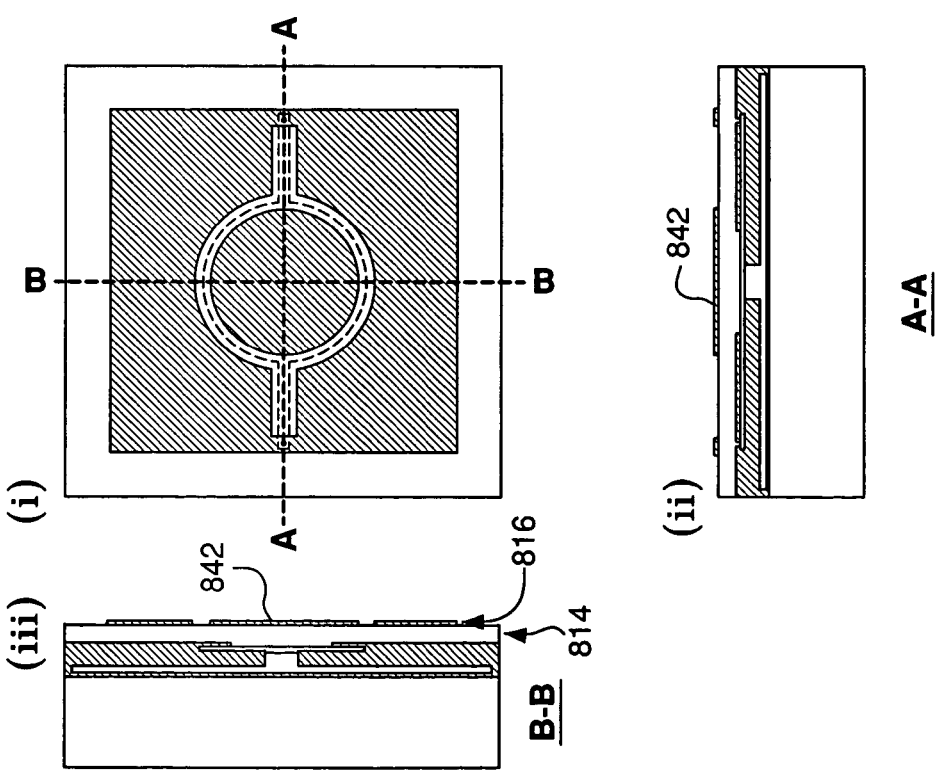

Referring to FIGS. 8E(i)-(iii), first, a relatively thick (poly) silicon layer 814 is deposited over layer 812. The material of layer 814 also fills vias 813 and 815. Then, a silicon-oxide layer 816 is deposited over layer 814. Finally, layer 816 is patterned and etched to form a mask 842 that maps electrode 742 onto layer 814.

Referring to FIGS. 8F(i)-(iii), first, a relatively thick (poly) silicon layer 818 is deposited over mask 842 and layers 816 and 814. After the deposition of layer 818, mask 842 is buried under that layer and becomes an embedded etch mask in wafer 720. Then, layer 818 is covered by a photoresist layer 820. Layer 820 is patterned as shown in FIG. 8F(i) to map electrodes 744a-b onto layer 818.

Figure 8H:
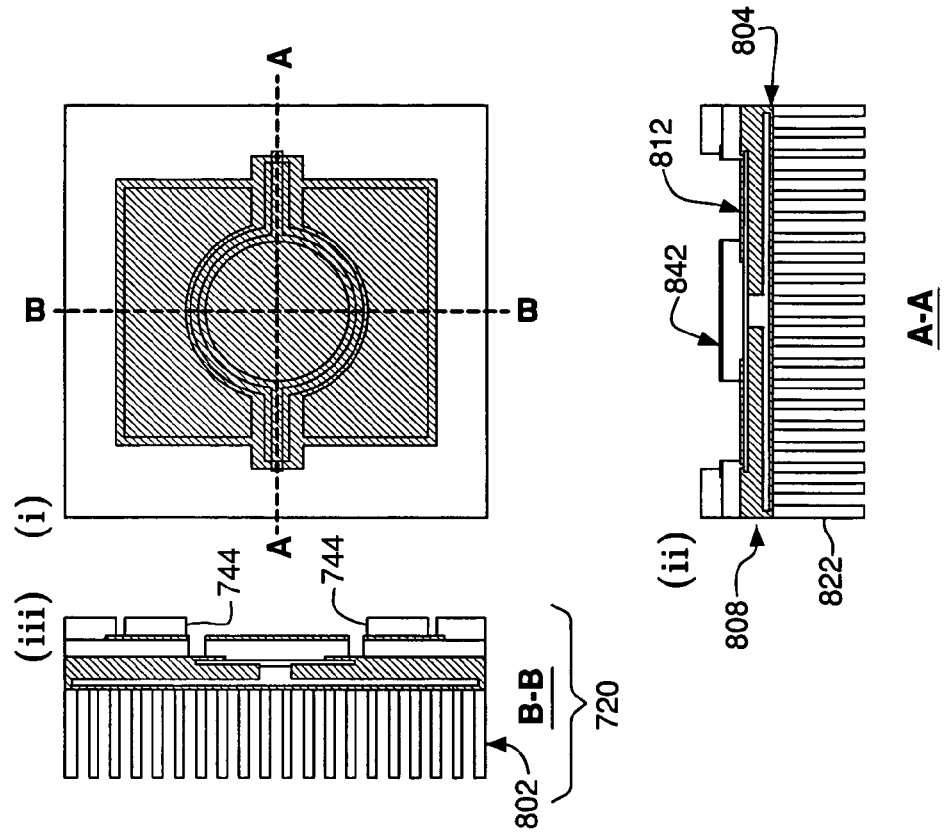
Figure 8G:
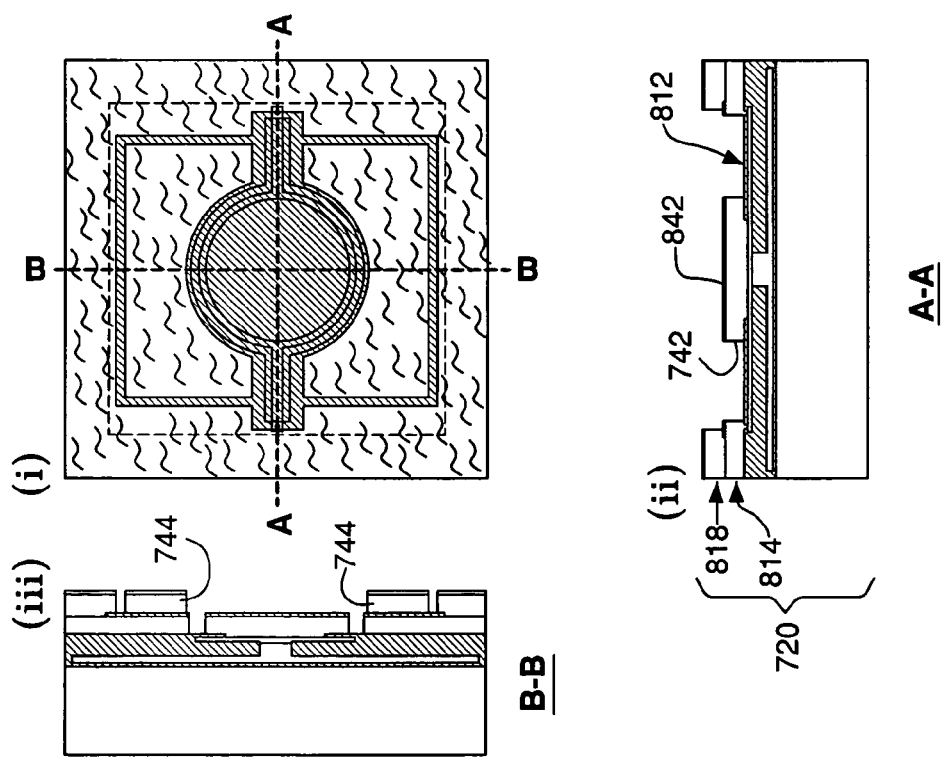

Referring to FIGS. 8G(i)-(iii), wafer 720 is subjected to a reactive ion etch (RIE) process, which creates opening 722 in the wafer (see also FIG. 7). The RIE process first removes exposed portions of layer 818 to form electrodes 744a-b. After electrodes 744a-b are formed in layer 818, the RIE process continues further to remove the exposed silicon from layer 814. However, due to the presence of mask 842, portions of layer 814 that are protected by the mask remain in place, thereby forming electrode 742, e.g., as shown in FIG. 8G(ii). Note that layer 812 acts as an etch stop for the RIE process.

Referring to FIGS. 8H(i)-(iii), first, substrate layer 802 is subjected to a DRIE etch to create a cradle 822. Note that layer 804 acts as an etch stop for the DRIE etch. After cradle 822 is created in substrate layer 802, photoresist layer 820 is stripped from the wafer. Metal pads (not shown) are then vapor coated onto the exposed top surface of electrodes 744a-b. Wafers 720 and 750 are bonded together as shown in FIG. 7 such that the metal pads coated onto electrodes 744a-b connect to leads 754a-b, respectively. One purpose of having cradle 822 in wafer 720 is to provide a capability to appropriately apply pressure to that wafer to achieve good bonding with wafer 750 (see also FIG. 7). Additional details on open grid structures analogous to cradle 822 and their use in wafer bonding can be found, e.g., in the above-cited U.S. patent application Ser. No. 10/395,362. Finally, exposed portions of mask 842 and oxide layers 812, 808, and 804 are removed (etched away) to detach cradle 822 and release plate 730, support column 732, springs 712, and electrode 742, as shown in FIG. 7.

While this invention has been described with reference to illustrative embodiments, this description is not intended to be construed in a limiting sense. Although methods of the inventions have been described in the context of using silicon/silicon oxide wafers, other suitable materials, such as germanium-compensated silicon, may similarly be used. The materials may be appropriately doped as known in the art. Various surfaces may be modified, e.g., by metal deposition for enhanced reflectivity and/or electrical conductivity or by ion implantation for enhanced mechanical strength. Various etching methods may be used to remove material from the wafers, e.g., analogous to the methods disclosed in U.S. Pat. No. 5,501,893, the teachings of which are incorporated herein by reference. Although methods of the invention have been described in reference to several representative MEMS structures and/or devices, various embodiments of these methods can similarly be used to fabricate non-MEMS or different MEMS structures and/or devices. Various modifications of the described embodiments, as well as other embodiments of the invention, which are apparent to persons skilled in the art to which the invention pertains are deemed to lie within the principle and scope of the invention as expressed in the following claims.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, microsystems, and devices produced using microsystems technology or microsystems integration.

Although the present invention has been described in the context of implementation as MEMS devices, the present invention can in theory be implemented at any scale, including scales larger than micro-scale.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A method of fabricating an integrated device, comprising:
   (A) forming first and second embedded masks in a multilayer wafer, each of said masks in contact with one or more layers of the wafer, wherein (i) the first embedded mask is in contact with a first layer of the wafer and (ii) the second embedded mask is in contact with a second different layer of the wafer; and
   (B) etching, using a first etchant, a portion of the first layer and a portion of the second layer from the wafer, wherein:
   the first embedded mask protects one or more other portions of the first layer from being removed by the first etchant during the etching;
   the second embedded mask protects one or more other portions of the second layer from being removed by the first etchant during the etching; and
   the first etchant is capable of removing material of the portions being protected by the first and second embedded masks.

2. The invention of claim 1, further comprising removing at least one of the first and second embedded masks from the wafer after performing the etching.

3. The invention of claim 1, wherein step (A) comprises:
   (A1) forming the first mask over the first layer of the wafer; and
   (A2) depositing a cover layer over the first mask and the first layer to embed the first mask into the wafer.

4. The invention of claim 3, wherein step (B) comprises front-side etching, wherein the first embedded mask protects portions of the first layer from being removed.

5. The invention of claim 3, wherein step (B) comprises backside etching, wherein the first embedded mask protects portions of the cover layer from being removed.

6. The invention of claim 3, wherein the first mask comprises silicon oxide and each of the first and cover layers comprises silicon.

7. The invention of claim 3, wherein at least one of the first and cover layers has a thickness of at least about 10 μm.

8. The invention of claim 1, wherein:
the wafer comprises a substrate layer and a plurality of layers deposited over the substrate layer; and
step (B) comprises creating an opening in the substrate layer to expose at least one of the first and second embedded masks.

9. The invention of claim 1, wherein step (B) comprises subjecting the wafer to dry etching, wherein at least one of the first and second embedded masks acts as an etch stop for the dry etch.

10. The invention of claim 1, wherein each of the first and second embedded masks is adapted to map a corresponding structure onto at least one of the one or more corresponding contact layers and step (B) comprises forming the mapped structures.

11. The invention of claim 10, wherein the formed structure defines a via having an aspect ratio of about 5:1 or greater.

12. The invention of claim 10, further comprising releasing at least one of the formed structures to make said structure movable with respect to the other formed structure.

13. The invention of claim 10, wherein:
the first embedded mask maps a first structure located at a first offset distance from a substrate; and
the second embedded mask maps a second structure located at a different second offset distance from the substrate.

14. The invention of claim 13, wherein:
the first structure is a first comb-shaped portion of a comb drive; and
the second structure is a second comb-shaped portion of the comb drive, said first and second comb-shaped portion being interleaved with one another.

15. The invention of claim 1, wherein step (A) comprises:
(A1) forming the first embedded mask over a substrate;
(A2) forming the second embedded mask over the substrate such that the first embedded mask is interposed between the second embedded mask and the substrate; and
(A3) depositing a layer that buries the second embedded mask, wherein the first and second masks have different patterns.

* * * * *